United States Patent
Lele et al.

(10) Patent No.: US 11,747,855 B2
(45) Date of Patent: Sep. 5, 2023

(54) SYNCHRONIZATION OF A CLOCK GENERATOR DIVIDER SETTING AND MULTIPLE INDEPENDENT COMPONENT CLOCK DIVIDER SETTINGS

(71) Applicant: TEXAS INSTRUMENTS INCORPORATED, Dallas, TX (US)

(72) Inventors: Atul Ramakant Lele, Bengaluru (IN); Per Torstein Roine, Oslo (NO)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/857,837

(22) Filed: Jul. 5, 2022

(65) Prior Publication Data

US 2022/0334610 A1    Oct. 20, 2022

Related U.S. Application Data

(63) Continuation of application No. 16/527,342, filed on Jul. 31, 2019, now Pat. No. 11,392,165.

(51) Int. Cl.
| | |
|---|---|
| *G06F 1/12* | (2006.01) |
| *G06F 1/06* | (2006.01) |
| *H04J 3/06* | (2006.01) |

(52) U.S. Cl.
CPC ............... *G06F 1/12* (2013.01); *G06F 1/06* (2013.01); *H04J 3/0679* (2013.01)

(58) Field of Classification Search
CPC ..................................... G06F 1/12; G06F 1/10
See application file for complete search history.

(56) References Cited

U.S. PATENT DOCUMENTS

| | | | |
|---|---|---|---|
| 4,970,588 A | 11/1990 | Kobayashi | |
| 5,982,210 A | 11/1999 | Rogers | |
| 6,118,314 A * | 9/2000 | Arnould | H04J 3/0685 |
| | | | 327/198 |
| 6,157,694 A | 12/2000 | Larsson | |
| 6,470,458 B1 * | 10/2002 | Dreps | G06F 1/10 |
| | | | 713/400 |
| 7,023,282 B1 | 4/2006 | Humpreys et al. | |

(Continued)

OTHER PUBLICATIONS

International Search Report for PCT/US2020/043688 dated Nov. 10, 2020.

*Primary Examiner* — Phil K Nguyen
(74) *Attorney, Agent, or Firm* — Carl G. Peterson; Frank D. Cimino

(57) ABSTRACT

A device includes a clock generator configured to generate a root clock signal based on an input clock signal and a clock generator divider integer setting. The device also includes a first component coupled to the clock generator and configured to generate a first component clock signal based on the root clock signal and a first component divider integer setting. The device also includes a second component coupled to the clock generator and configured to generate a second component clock signal based on the root clock signal and a second component divider integer setting. The device also includes sync circuitry coupled to each of the clock generator, the first component, and the second component, wherein the sync circuitry is configured to perform synchronized adjustments to the root clock signal, the first component clock signal, and the second component clock signal.

20 Claims, 4 Drawing Sheets

(56) References Cited

U.S. PATENT DOCUMENTS

| | | | |
|---|---|---|---|
| 7,253,673 B2 | 8/2007 | Lin | |
| 8,134,389 B2 | 3/2012 | Huang | |
| 8,362,819 B1* | 1/2013 | Kris | H03K 7/08 |
| | | | 327/175 |
| 10,007,639 B2* | 6/2018 | Mitric | G06F 13/364 |
| 10,075,284 B1* | 9/2018 | Rodrigues | H04J 3/0688 |
| 10,790,845 B1* | 9/2020 | Zanchi | H03M 1/0836 |
| 10,871,796 B1* | 12/2020 | Gaide | H03K 19/177 |
| 2002/0186628 A1* | 12/2002 | Hoshino | G11B 7/005 |
| 2005/0275713 A1 | 12/2005 | Kawai | |
| 2005/0289405 A1* | 12/2005 | Rivoir | G06F 1/12 |
| | | | 714/700 |
| 2014/0269227 A1 | 9/2014 | Bobev et al. | |
| 2015/0061781 A1 | 3/2015 | Shimura | |
| 2016/0182217 A1* | 6/2016 | Hashizume | H04J 3/0685 |
| | | | 375/354 |
| 2017/0134031 A1 | 5/2017 | Ezell et al. | |
| 2019/0379475 A1* | 12/2019 | Seethamraju | H04J 3/0667 |

* cited by examiner

SYNCHRONIZATION OF A CLOCK GENERATOR DIVIDER SETTING AND MULTIPLE INDEPENDENT COMPONENT CLOCK DIVIDER SETTINGS

CROSS-REFERENCE TO RELATED APPLICATIONS

This application is a Continuation of U.S. patent application Ser. No. 16/527,342, filed on Jul. 31, 2019, which is incorporated by reference herein in its entirety.

BACKGROUND

Some electronic systems include multiple clocked components, where at least some of the individual clocked components use a divider to reduce a system or root clock signal to a lower frequency clock signal for use by component sub-systems. In an example electronic system, a system-on-a-chip (SoC) circuit includes multiple components with respective clock dividers for different processor sub-systems and peripherals to enable performance and power flexibility to each of them. The power flexibility of the SoC circuit can be increased if the root clock signal is adjustable. However, such adjustments to the root clock signal are problematic in system scenarios where different component clock dividers have different divider settings and different divider output options. For example, changing the root clock by one of the components can affect the divided clock of other components.

SUMMARY

In accordance with at least some examples of the disclosure, a device comprises a clock generator configured to generate a root clock signal based on an input clock signal and a clock generator divider integer setting. The device also comprises a first component coupled to the clock generator and configured to generate a first component clock signal based on the root clock signal and a first component divider integer setting. The device also comprises a second component coupled to the clock generator and configured to generate a second component clock signal based on the root clock signal and a second component divider integer setting. The device also comprises sync circuitry coupled to each of the clock generator, the first component, and the second component, wherein the sync circuitry is configured to synchronize adjustments to the root clock signal, the first component clock signal, and the second component clock signal.

In accordance with at least some example of the disclosure, an integrated circuit comprises a clock generator with a clock generator divider configured to divide a phase-locked loop (PLL) output clock signal to generate a root clock signal. The integrated circuit also comprises a first component coupled to an output node of the clock generator, wherein the first component comprises a first component divider configured to divide the root clock signal to generate a first component clock signal. The integrated circuit also comprises a second component coupled to the output node of the clock generator, wherein the second component comprises a second component divider configured to divide the root clock signal to generate a second component clock signal. The integrated circuit also comprises sync circuitry included with or coupled to the clock generator, the first component, and the second component, wherein the sync circuitry is configured to synchronize adjustments to a clock generator divider integer setting, a first component divider integer setting, and a second component divider integer setting.

In accordance with at least some example of the disclosure, a system comprises a clock generator with a clock generator divider having a clock generator divider integer setting. The system also comprises a first component coupled to an output node of the clock generator, wherein the first component includes a first component divider having a first component divider integer setting. The system also comprises a second component coupled to an output node of the clock generator, wherein the second component includes second component divider having a second component divider integer setting. The system also includes a first sync circuit associated with the clock generator, a second sync circuit associated with the first component, and a third sync circuit associated with the second component. The first, second, and third sync circuits are configured to synchronize adjustments to a root clock signal output from the clock generator divider, a first component clock signal output from the first component divider, and a second component clock signal output from the second component divider.

BRIEF DESCRIPTION OF THE DRAWINGS

For a detailed description of various examples, reference will now be made to the accompanying drawings in which.

DETAILED DESCRIPTION

Figure 1:
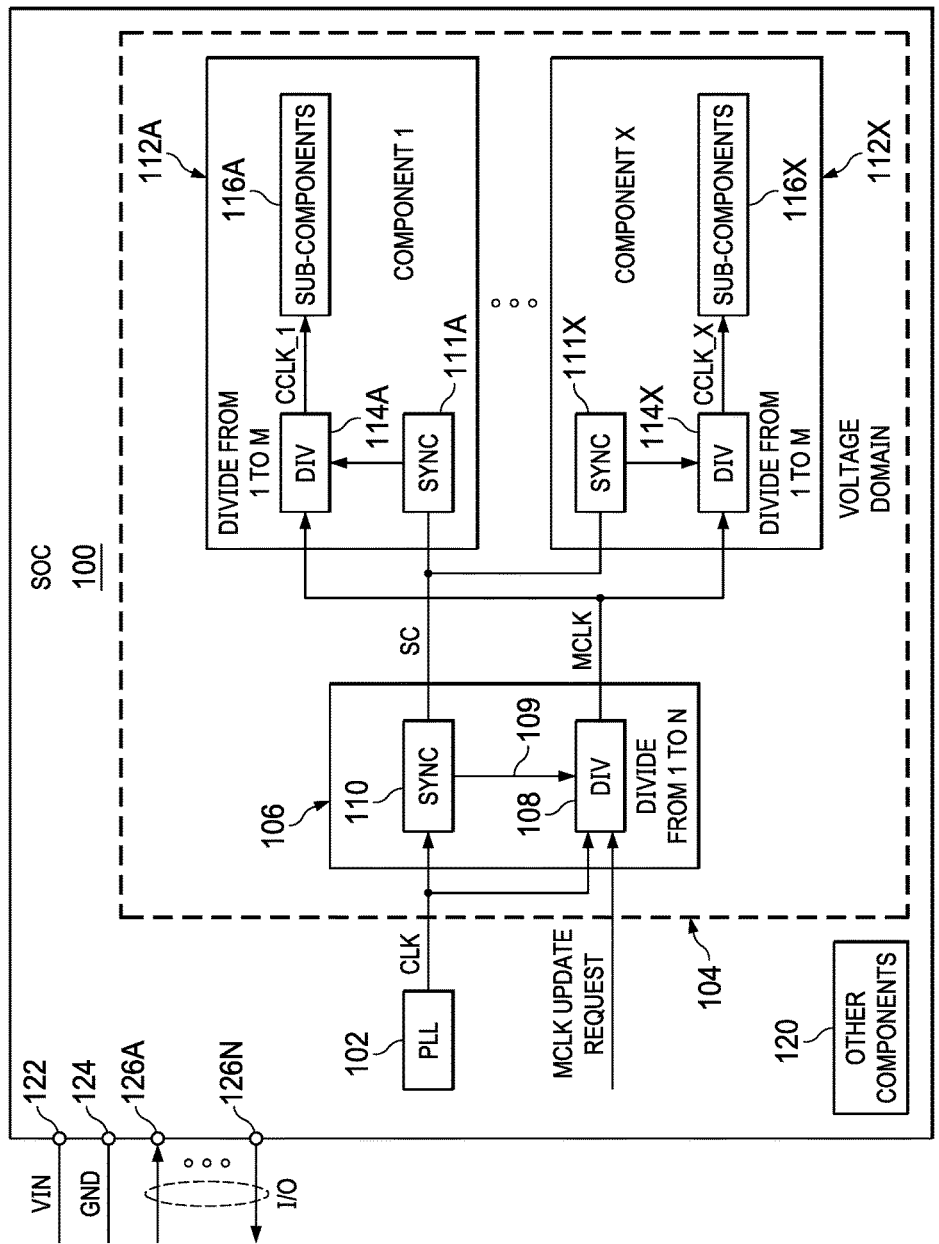
FIG. 1 is a block diagram showing a system in accordance with some examples.

Disclosed herein are synchronization scenarios for a clock generator divider setting and multiple independent component clock divider settings. An example synchronization scenario involves an electronic system or system-on-a-chip (SoC) with a clock generator and multiple components coupled to the clock generator and the multiple components configured to receive an output clock signal from the clock generator. In the example synchronization scenario, the clock generator and each of the multiple components include respective dividers, where the clock generator divider and each component clock divider has its own integer setting. When the clock generator divider receives a root clock divider integer setting update request or trigger (e.g., to transition to a higher or lower root clock setting for the system), sync circuitry included with or coupled to the clock generator divider and each component clock divider operates to ensure the clock divider integer setting update and component clock divider integer setting updates are performed together. Also, each component clock divider integer setting may be updated independently from each other. In different scenarios, respective component clock divider outputs stay the same or change in response to the root clock signal being adjusted up or down.

In some examples, the sync circuitry includes a first sync circuit with a counter configured to provide a count value that tracks an alignment position of the input clock signal to the clock generator divider, the root clock signal, the first component clock signal, and the second component clock signal. In one example, the alignment position occurs once for every 60 clock cycles of the input clock signal to the clock generator divider. In other examples, the number of clock cycles corresponding to the alignment position varies according to the least common multiple (LCM) of all possible divider settings. Regardless of the number of clock cycles of the input clock signal between adjacent alignment positions, the first sync circuit is configured to transmit a sync control signal to the first and second components at a period of the input clock signal just before a subsequent alignment position in response to a root clock signal update trigger. In some examples, the root clock signal update trigger is provided by a system or SoC controller configured to manage power consumption and speed options of the system or SoC. In response to the sync control signal provided by the first sync circuit, the first and second components are configured to update their respective divider integer settings so that updates to the root clock signal, the first component clock signal, and the second component clock signal occur together at the alignment position. To accomplish such synchronization, the first and second components include respective sync circuits configured to control when changes to the first component clock signal and the second component clock signal occur. In operation, the first component clock divider operates to selectively output pulses of the root clock signal as pulses of the first component clock divider. Likewise, the second component clock divider operates to selectively output pulses of the root clock signal as pulses of the second component clock divider, where the integer settings used by the first and second components dividers are independent from each other.

In some examples, a first component clock divider comprises a clock gate and a clock gate controller coupled to the clock gate and to the respective sync circuitry. The clock gate is coupled to the clock generator to receive the output of the clock generator divider. In some examples, the clock gate controller is configured to control when the clock gate passes a pulse of the root clock signal as a pulse from the first component clock divider. More specifically, in some examples, the clock gate controller comprises an accumulator, where only a non-negative output of the accumulator causes the first component clock divider to produce a first component clock signal pulse. In some examples, the accumulator outputs an accumulator value that is a function of a number of values available for the clock generator divider integer setting, a number of values available for each respective component clock divider integer setting (e.g., assume there are two or more components with respective dividers), and an alignment position of the input clock signal to the clock generator divider, the root clock signal output from the clock generator divider, and any component clock divider outputs in the system.

In some examples, a second component clock divider comprises a clock gate and a clock gate controller coupled to the clock gate and to respective sync circuitry. The clock gate is coupled to the clock generator to receive the output of the clock generator divider. In some examples, the clock gate controller is configured to control when the clock gate passes a pulse of the root clock signal as a pulse from the second component clock divider. More specifically, in some examples, the clock gate controller comprises an accumulator, where only a non-negative output of the accumulator causes the second component clock divider to produce a second component clock signal pulse. In some examples, the accumulator outputs an accumulator value that is a function of a number of values available for the clock generator divider integer setting, a number of values available for each respective component clock divider integer setting (e.g., assume there are two or more components with respective dividers), and an alignment position of the input clock signal to the clock generator divider, the root clock signal output from the clock generator divider, and any component clock divider outputs in the system.

In some examples, a system includes three or more components (e.g., processing components or peripheral components) configured to use a root clock signal, where each component has its own divider integer setting, and where sync circuitry aligns a clock generator divider integer setting update (resulting in an adjusted root clock signal) with respective component clock divider integer settings updates (resulting in independent component clock signals). Regardless of the particular sync circuitry components used and the number of component clock dividers in the system or SoC, the sync circuitry enables synchronization for a clock generator divider integer setting and multiple independent component clock divider integer settings. To provide a better understanding, various synchronization options for a clock generator divider integer setting and multiple independent component clock divider integer settings, along with related systems and methods, are described using the figures as follows.

FIG. 1 is a block diagram showing a system in accordance with some examples. As shown, the system in FIG. 1 is represented as a SoC 100 with a phase-locked loop (PLL) 102 coupled to a clock generator 106. Also, the clock generator 106 is coupled to a plurality of components 112A-112X. In some examples, the clock generator 106 and the components 112A-112X are part of a voltage domain 104 of the SoC 100. In some examples, the voltage domain 104 represents a group of components (e.g., the clock generator 106 and the components 112A-112X) that receive an adjustable supply voltage level to enable power flexibility for the SoC 100. In some examples, the SoC 100 includes other components 120, such as other voltage domains with respective components.

In the example of FIG. 1, the SoC 100 includes a voltage supply (VIN) pin 122, a ground (GND) pin 124, and input/output (I/O) pins 126A-126N. In some examples, VIN is used to provide power to the components of the voltage domain 104 directly. In other examples, VIN is adjusted to another voltage level and this other voltage level is used to power the components of the voltage domain 104. In one example, VIN is provided from a pin of the SoC 100 (i.e., from a voltage source external to the SoC 100). In other examples, VIN is generated within the SoC 100 by an internal voltage regulator.

In operation, the PLL 102 provides a PLL output clock signal (CLK) to a divider 108 of the clock generator 106. In the example of FIG. 1, the divider 108 is configured to divide CLK by a divider integer setting that ranges from 1 to N. The output of the divider 108 is a root clock signal (MCLK) provided to the components 112A-112X. As shown, the clock generator 106 also includes a sync circuit 110 coupled to the divider 108. More specifically, the divider 108 is configured to receive a MCLK update request (also referred to as a root clock divider integer setting update request or trigger, or MCLK DIV CONFIGURATION) to update MCLK by adjusting the divider integer setting of the divider 108. In different examples, the MCLK update request is provided by a controller (not shown) within the SoC 100 or a controller outside the SoC 100.

When the divider 108 receives a root clock divider integer setting update request or trigger (e.g., to transition to a higher or lower root clock setting for the SoC 100), the update request is put on hold by the divider 108 until a control signal 109 is received from the sync circuit 110. In some examples, the sync circuit 110 includes timing logic (e.g., a counter and a comparator) to track when a clock cycle for the clock generator 106 is aligned with the clock cycle for all of the components 112A-112X. When alignment occurs (or just before), the control signal 109 is asserted so that updates to the clock divider integer setting of the divider 108 and respective clock divider integer settings for the components 112A-112X are performed together. As described herein, each component clock divider integer setting may be independent from each other so that respective component clock divider outputs stay the same even when the root clock signal is adjusted up or down. After a synchronized update, each of the components 112A-112X operates to adjust its respective clock divider integer setting as desired.

In some examples, the sync circuit 110 includes a counter and a comparator (see e.g., the sync circuit 206 of FIG. 2) configured to determine when a count value that tracks an alignment position of the input clock signal (CLK), the root clock signal (MCLK), and the component clock signals (CCLK_1-CCLK_X) is reached. In one example, the alignment position occurs once for every 60 clock cycles of CLK. In this example, the counter counts the clock cycles of CLK and the comparator determines when the counts reaches a threshold (e.g., 59 counts) just before the alignment position. In different examples, the alignment position varies according to the least common multiple (LCM) of all possible divider settings (e.g., all factors of N and K, where N is the divider settings available for the divider 108 and K is the divider settings available for the dividers 114A-114X). In some examples, the sync circuit 110 is configured to transmit a sync control (SC) signal to the components 112A-112X at a period of CLK just before a subsequent alignment position in response to a root clock signal update trigger.

In some examples, the SC signal from the sync circuit 110 is used by the components 112A-112X to trigger a new divider integer setting for each of the respective dividers 114A-114X. More specifically, in some examples, the new divider integer settings for the dividers 114A-114X determine how many of the new MCLK pulses provided by the divider 108 will be output from the respective dividers 114A-114X (as CCLK_1 to CCLK_X pulses). In one example, respective sync circuits 111A-111X for the components 112A-112X use the SC signal from the sync circuit 110 to initiate a comparison of the requested divider integer setting for the divider 108 and the respective divider integer setting options for each of the respective dividers 114A-114X. The comparison results determine the new divider integer setting for each of the dividers 114A-114X, where the new divider integer settings for the respective dividers 114A-114X are used for gate control to selectively allow MCLK pulses to be passed as CCLK_1 to CCLK_X pulses.

Also, in some examples, the root clock signal update trigger is provided by a system or SoC controller (not shown) configured to manage power consumption and speed options of the SoC 100. In response to the SC signal provided by the sync circuit 110, the components 112A-112X are configured to update their respective divider integer settings so that updates to the root clock signal and each respective component clock signal occur together at the alignment position. After synchronization, each of the components 112A-112X operates to selectively output pulses of the root clock signal as pulses of a respective component clock divider, where the integer settings used by the component clock dividers 114A-114X of the components 112A-112X are independent from each other.

In some examples, the components 112A-112X represent processing components, peripheral components, and/or other components configured to use a root clock signal, where each of the components 112A-112X has its own divider integer setting, and where respective sync circuit 111A-110X aligns a clock generator divider integer setting update (resulting in an adjusted root clock signal) with respective component clock divider integer settings updates (resulting in independent component clock signals CCLK_1-CCLK_X). In FIG. 1, the component clock signals CCLK_1-CCLK_X are provided to respective sub-components 116A-116X for each component 112A-112X. Regardless of the particular sync circuitry components used and the number of component clock dividers in the SoC 100, the sync circuit 110 and the sync circuits 111A-111X enable synchronization for a clock generator divider integer setting and independent component clock divider integer settings. To summarize, in some examples, each of the components 112A-112X operates to independently adjust its divider integer setting relative to a root clock signal. In addition, each of the components 112A-112X operates to independently adjust its divider integer setting to respond to root clock signal updates such that component clock divider integer setting updates are synchronized with a clock generator divider integer setting update.

Figure 2:
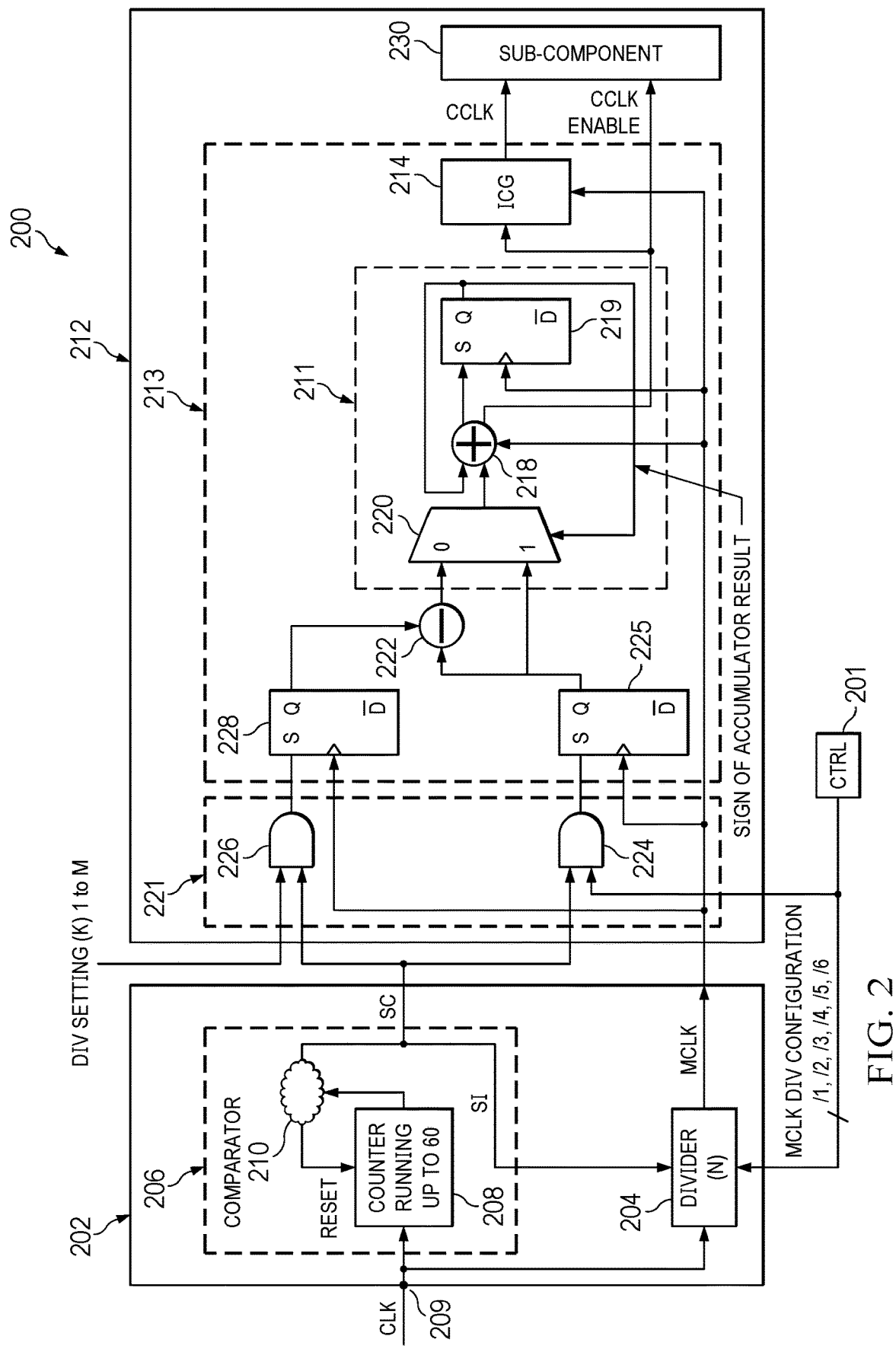
FIG. 2 is a block diagram showing a clock generator and a component in accordance with some examples.

FIG. 2 is a block diagram showing a clock generator 202 (an example of the clock generator 106 in FIG. 1) and a component 212 (an example of one of the components 112A-112X) in accordance with some examples. As shown, the clock generator 202 comprises a divider 204 (an example of the divider 108 in FIG. 1) and a sync circuit 206 (an example of the sync circuit 110 in FIG. 1). More specifically, the clock generator 202 receives an input clock signal, CLK (e.g., a PLL output clock signal), via an input node 209. CLK is provided to the divider 204 and the sync circuit 206. As shown, the output of the divider 204 is MCLK, where MCLK is CLK divided by a selectable integer, N. In the example of FIG. 2, N is selected by a controller 201 external to the clock generator 202 and the component 212. The controller 201, for example, is responsible for managing power consumption in a system that includes the clock generator and multiple components (e.g., the components 112A-112X in FIG. 1) including the component 212.

In some examples, the sync circuit 206 includes a counter 208 and a comparator 210, where the counter 208 is configured to count clock cycles up to a predetermined number (e.g., 60 clock cycles). Once the counted clock cycles reach the predetermined number, the comparator 210 asserts a reset signal to the counter 208, which re-starts the counting process. The comparator 210 also outputs a control signal (S1) to the divider 204, which enables the divider 204 to begin generating a new MCLK pulse from CLK based on a clock generator divider integer setting update request (MCLK DIV CONFIGURATION) provided by the controller 201. Thus, even if a generator divider integer setting update is received before the next alignment position between the clock generator 202 and the component 212, the sync circuit 206 does not assert S1 to the divider 204 until the alignment position or the clock cycle before the alignment position. In this manner, updates to MCLK occur at the alignment position.

In the example of FIG. 2, the component 212 comprises a divider 213 (an example of any one of the dividers 114A-114X) and a sync circuit 221 (an example of any one of the sync circuits 111A-111X). More specifically, the divider 213 comprises a clock gate 214 and a clock gate controller 211 coupled to the clock gate 214. In some examples, the clock gate 214 may be an integrated clock gating (IGC) cell. As shown, the clock gate controller 211 includes a multiplexer 220 coupled to the sync circuit 221. In operation, the multiplexer 220 selects one of two values provided by a latch 225 and a combine circuit 222. The output of the multiplexer 220 is input to an accumulator 218 of the clock gate controller 211. Also, the output of the accumulator 218 is provided to a latch 219, which is clocked by MCLK. The output of the latch 219 is provided as one of the inputs to the accumulator 218. As shown, the accumulator 218 also provides an output (CCLK enable) to the clock gate 214 and to a sub-component 230 (an example of any one of the sub-components 116A-116X). In some examples, when the output of the accumulator is greater than 0, the CCLK enable signal causes the clock gate 214 to pass one pulse of MCLK as the CCLK signal.

In the example of FIG. 2, the timing for providing the two inputs to the multiplexer 220 is controlled by the sync circuit 221. More specifically, in some examples, the sync circuit 221 includes AND gates 224 and 226 coupled to the sync circuit 206 of the clock generator 202. When the SC signal from the sync circuit 206 is high, the AND gate 226 passes K (the component clock divider integer setting) to a latch 228 clocked by MCLK. Also, when the SC signal from the sync circuit 206 is high, the AND gate 224 passes MCLK DIV CONFIGURATION (the clock generator divider integer setting) to a latch 225 clocked by MCLK. The output of the latches 228 and 225 is provided to a combine circuit 222, which provides the difference between MCLK DIV CONFIGURATION and K as one of the inputs to the multiplexer 220. The other input to the multiplexer 220 is MCLK DIV CONFIGURATION, which is provided by the latch 225.

To summarize, the sync circuit 221 is configured to control when MCLK DIV CONFIGURATION (the clock generator divider integer setting) or the difference between MCLK DIV CONFIGURATION and K (the component clock divider integer setting) is provided to the multiplexer 220 of the divider 213, where the control signal for the multiplexer 220 is the sign of the accumulator output. Thus, when the accumulator output is non-negative (the sign to the multiplexer 220 is 0), the difference between MCLK DIV CONFIGURATION and K is provided to the accumulator 218. Also, when the accumulator output is negative (the sign to the multiplexer 220 is 1), MCLK DIV CONFIGURATION is provided to the accumulator 218.

In some examples, synchronization operations result in the value of K being adjusted so that a frequency of CCLK stays the same relative to the frequency of CCLK before a given MCLK update request. In other examples, synchronization operations result in the value of K being adjusted so that a frequency of CCLK increases relative to the frequency of CCLK before a given MCLK update request. In other examples, the synchronization operations result in the value of K being adjusted so that a frequency of CCLK decreases relative to the frequency of CCLK before a given MCLK update request. In these different examples, the clock gate controller 211 is configured to control when the clock gate 214 passes a pulse or positive clock edge of MCLK as a pulse or positive clock edge of CCLK.

In the example of FIG. 2, the control signal for the clock gate 214 is managed by the accumulator 218 based on information. In some examples, only a non-negative output of the accumulator 218 causes the divider 213 to produce a CCLK pulse. In some examples, the accumulator 218 outputs an accumulator value that is a function of a number of values available for the clock generator divider integer setting, a number of values available for each respective component clock divider integer setting (assume there are two or more component clock dividers), an alignment position of the input clock signal to the clock generator 202, the root clock signal (MCLK) output from the clock generator divider, and any component clock divider outputs (CCLKs). As previously discussed, the accumulator 218 receives an input from the multiplexer 220, where the multiplexer 220 passes one of two inputs to the accumulator 218 based on the sign of the output of the accumulator 218. In other sync scenarios, a plurality of component clock dividers, similar to the divider 213, and respective outputs are synced to an MCLK update.

In other sync scenarios at least three components (e.g., processing components or peripheral components) with respective component clock dividers (e.g., the component clock divider 213) are configured to use MCLK as a root clock signal, where each component has its own clock divider integer setting, and where sync circuitry (e.g., the sync circuit 206 and the sync circuit 221 in FIG. 2) aligns a clock generator divider integer setting update (to update MCLK) with respective component clock divider integer settings updates (resulting in respective CCLKs). Regardless of the particular sync circuitry components used and the number of component clock dividers in a sync scenario, the sync circuitry enables synchronization for a clock generator divider integer setting and multiple independent component clock divider integer settings.

To summarize, in some examples, each component clock divider (e.g., the component clock divider 213 of FIG. 2) uses an accumulator (e.g., the accumulator 218 in FIG. 2) to track and control the clock frequency output for a particular component irrespective of root/system clock frequency changes. More specifically, each component clock divider (e.g., the component clock divider 213 of FIG. 2) is configured to receive the clock generator divider integer setting (e.g., MCLK DIV CONFIGURATION) related to the root clock (MCLK), and to track requested updates to MCLK. Each component clock divider (e.g., the component clock divider 213 of FIG. 2) is also configured to receive the component clock divider integer setting (K) for a component (e.g., a peripheral and/or central processing unit (CPU)). If MCLK DIV CONFIGURATION changes its value, each component clock divider (e.g., the component clock divider 213 of FIG. 2) is configured to account for the change in MCLK DIV CONFIGURATION by adjusting their respective values of K. In some examples, synchronization between updates to MCLK DIV CONFIGURATION and each respective K is done at a specific time or clock edge to avoid an unwanted number of clock edges (extra clock edges or fewer clock edges relative to a target) and to provide the same average frequency intended as an output for each component clock divider (e.g., the component clock divider 212 of FIG. 2).

As an example, assume the CLK signal to the clock generator 202 (e.g., a PLL output clock signal) is 240 MHz, where N is the minimum of all clock divider values used for different CPUs and Peripherals. In this example (where the PLL output clock signal is 240 MHz), the component clock divider values for components could be any of 1, 2, 3, 4, 5, 6, 10, 12, 15, 20, 30, which are factors of 60 (the least common multiple of the divider values in the example given). Also, N is the minimum of all such values {K1 . . . Km}, where m is number of component clock dividers in the system. If K1=2, K2=2, K3=20, K4=30, K5=12, . . . , Km=15, then N=Min {2, 2, 20, 30, 12, 15}=2. Accordingly, in the above example, MCLK=240 MHz/2=120 MHz, and the clock output of K5=20 MHz which is 240 MHz/12. As another example, if K1=6, K2=6, K3=20, K4=30, K5=12, . . . , Km=15, then N=Min{6, 6, 20, 30, 12, 15}=6. Accordingly, in the above example, MCLK=240 MHz/6=40 MHz, and the clock output of K5 is 20 MHz, which is 240 Mhz/12.

In the above examples, a SYNC pulse generated on 59th clock pulse of the CLK signal, which is used as an enable signal to load a new divisor value either at clock generator divider (to output MCLK) or the component clock dividers (to output CCLK). Otherwise, the clock divider output can be a higher clock frequency if the values are changed in arbitrary clock cycle. If 60 is the least common multiple (LCM) of the divider values, the rising edges of all the dividers are guaranteed to align after 60 clock pulses.

In some examples, the clock divider management options described herein to provide MCLK and CCLKs are used in a microcontroller unit (MCU) and connectivity scenario with multiple processors, where each CPU and its associated peripherals work as a group. In such a scenario, each group should be able to operate independently of each other without affecting the performance requirement of other group(s). With the clock divider management options described herein, inter process communication software overhead and re-initialization of clock dividers can be avoided. Accordingly, a system can continue to run seamlessly even with dynamic frequency changes of MCLK and/or CCLKs. With the clock divider management options described herein, energy consumption, system performance, and "ease of use" for software are improved over other clock divider management schemes.

Figure 3A:
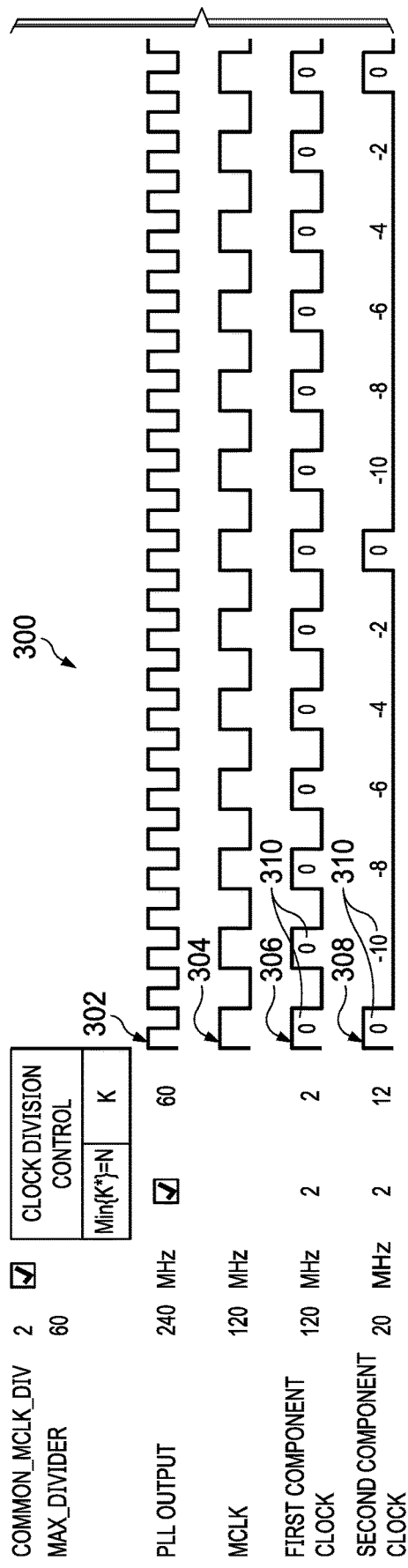
FIGS. 3A and 3B are timing diagrams showing related clock signals in accordance with some examples.
Figure 3B:
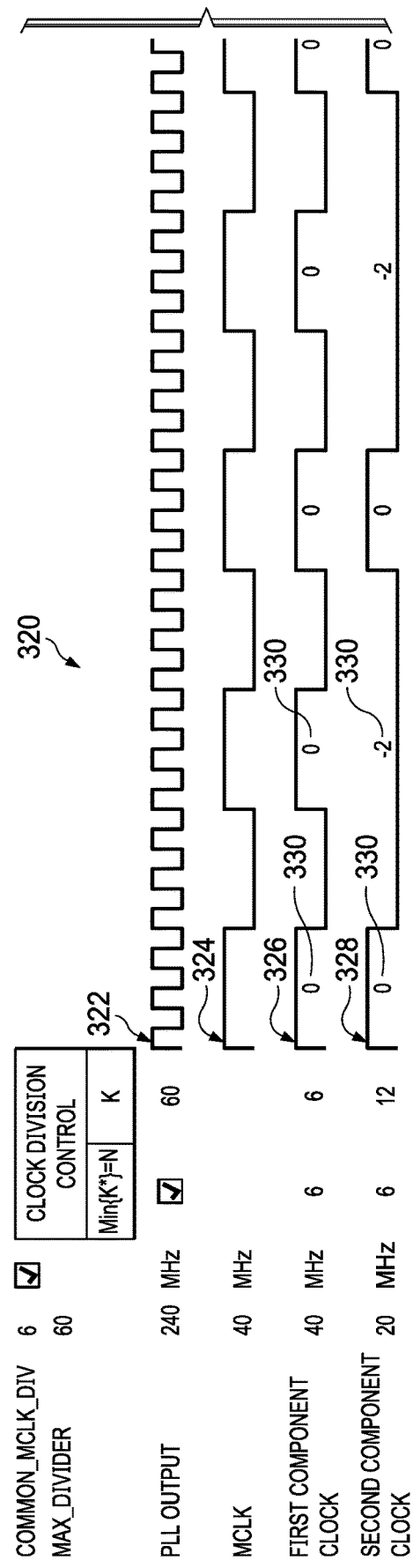

FIGS. 3A and 3B are timing diagrams 300 and 320 showing related clock signals in accordance with some examples. In the timing diagram 300 of FIG. 3A, a CLK signal 302 (e.g., a PLL output clock signal), an MCLK signal 304, a first component clock signal 306, and a second component clock signal 308 are represented. In the example of FIG. 3A, each period of the MCLK signal 304 is two periods of the CLK signal 302. Relative to the MCLK signal 304, the first component clock signal 306 is the same. This is because the divider integer setting for the first component corresponding to the first component clock signal 306 is equal to 1. In contrast, the second component clock signal 308 includes a pulse for every sixth pulse of MCLK (e.g., output one MCLK pulse, skip five MCLK pulses, output one MCLK, skip five MCLK pulses, and so on). This is because the divider integer setting for the second component corresponding to the second component clock signal 308 is equal to 6. In the timing diagram 300, various accumulator values 310 related to the first component clock signal 306 and the second component clock signal 308 are also represented, where non-negative accumulator values 310 result in a pulse for the first component clock signal 306 and the second component clock signal 308. More specifically, the accumulator values 310 for the first component clock signal 306 stay at zero. Meanwhile, the accumulator values 310 for the second component clock signal 308 range from −10 to 0, where pulses are output (by clock gating MCLK) for the second component clock signal 308 only when the accumulator value 310 is non-negative (e.g., zero in FIG. 3A).

In the timing diagram 320 of FIG. 3B, a CLK signal 322, an MCLK signal 324, a first component clock signal 326, and a second component clock signal 328 are represented. In the example of FIG. 3B, each period of the MCLK signal 324 is three periods of the CLK signal 322. Relative to the MCLK signal 324, the first component clock signal 326 is the same. This is because the divider integer setting for the first component corresponding to the first component clock signal 326 is equal to 1. In contrast, the second component clock signal 328 includes a pulse for every other pulse of MCLK (e.g., output one MCLK pulse, skip one MCLK pulse, output one MCLK, skip one MCLK pulse, and so on). This is because the divider integer setting for the second component corresponding to the second component clock signal 328 is equal to 2. In the timing diagram 320, various accumulator values 330 related to the first component clock signal 326 and the second component clock signal 328 are also represented, where non-negative accumulator values 330 result in a pulse for the first component clock signal 326 and the second component clock signal 328. More specifically, the accumulator values 330 for the first component clock signal 326 stay at zero. Meanwhile, the accumulator values 330 for the second component clock signal 328 range from −2 to 0, where pulses are output (by clock gating MCLK) for the second component clock signal 328 only when the accumulator value 330 is non-negative (e.g., zero in FIG. 3B).

Figure 4:
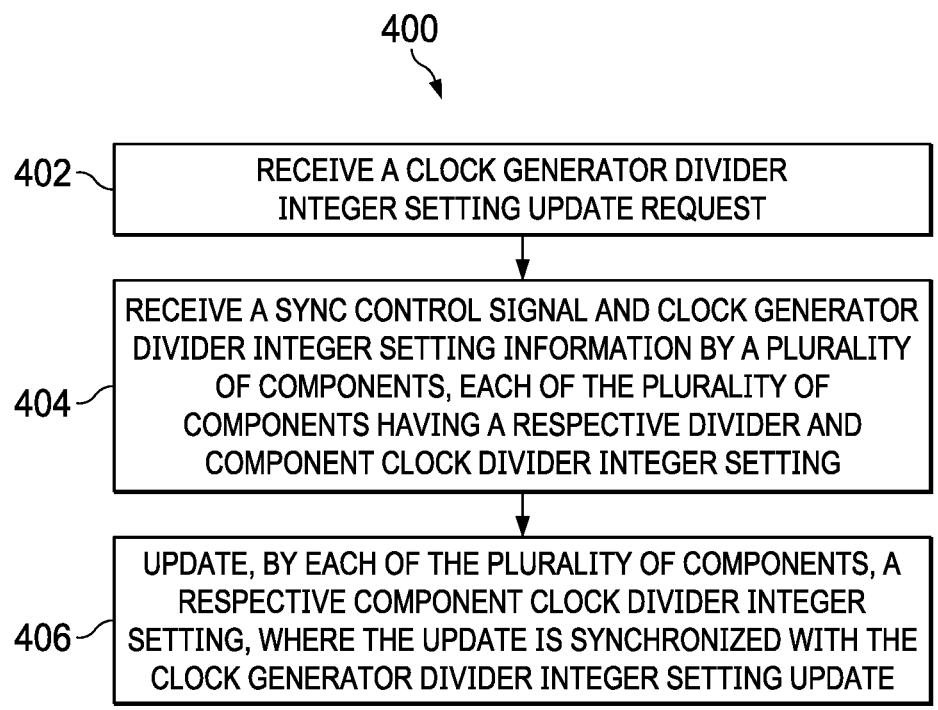
FIG. 4 is a flowchart showing a synchronization method for a clock generator and a component in accordance with some examples.

FIG. 4 is a flowchart showing a synchronization method 400 for a clock generator (e.g., the clock generator 106 in FIG. 1, or the clock generator 106A in FIG. 2) and a component (e.g., one of the components 112A-112X in FIG. 1, or the component 212 in FIG. 2) in accordance with some examples. As shown, the method 400 comprises receiving a clock generator divider integer setting update request (e.g., the MCLK update request in FIG. 1, or MCLK DIV CONFIGURATION in FIG. 2) at block 402. In some examples, block 402 is performed by a clock generator (e.g., the clock generator 106 in FIG. 1, or the clock generator 106A in FIG. 2) and by a component (e.g., one of the components 112A-112X in FIG. 1, or the component 212 in FIG. 2). At block 404, a sync control signal (e.g., the SC signal in FIGS. 1 and 2) and a clock generator divider integer setting update information are received by a plurality of components (e.g., the components 112A-112X in FIG. 1, or the component 212 in FIG. 2), where each of the plurality of components has a respective divider and component clock divider integer setting. At block 406, a respective component clock divider integer setting is updated by each of the plurality of components (e.g., one of the components 112A-112X in FIG. 1, or the component 212 in FIG. 2), where the update is synchronized with the clock generator divider integer setting update. In the method 400, each component clock divider integer setting may be independent from other component clock divider integer settings as described herein.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
   receiving, by an integrated circuit (IC) component, a root clock signal;
   generating, by the IC component, a component clock signal responsive to the root clock signal;
   receiving, by the IC component, an updated root clock signal, the updated root clock signal having a different frequency than the root clock signal;
   receiving, by the IC component, a synchronization control signal and a clock generator divider integer setting used to generate the updated root clock signal; and
   generating, by the IC component, an updated component clock signal responsive to the updated root clock signal, the synchronization control signal, the clock generator divider integer setting, and a component divider integer setting.

2. The method of claim 1, wherein the component divider integer setting is a first component divider integer setting and the method includes generating, by the IC component, the component clock signal responsive to the root clock signal and a second component divider integer setting different than the first component divider integer setting.

3. The method of claim 1 further comprising:
   tracking an alignment position for the updated root clock signal, the updated component clock signal, and an input clock signal used to generate the updated root clock signal; and
   providing the synchronization control signal to the IC component at a time that is based on the tracked alignment position.

4. The method of claim 1 further comprising:
   obtaining, by the IC component, a first gated result responsive to the synchronization control signal and the clock generator divider integer setting;
   obtaining, by the IC component, a second gated result responsive to the synchronization control signal and the component divider integer setting; and
   generating, by the IC component, the updated component clock signal responsive to the first gated result and the second gated result.

5. The method of claim 1 further comprising:
   obtaining, by the IC component, a first gated result responsive to the synchronization control signal and the clock generator divider integer setting;
   obtaining, by the IC component, a second gated result responsive to the synchronization control signal and the component divider integer setting;
   obtaining, by the IC component, a first latched result responsive to the first gated result and the updated root clock signal;
   obtaining, by the IC component, a second latched result responsive to the second gated result and the updated root clock signal; and
   generating, by the IC component, the updated component clock signal responsive to the first latched result and the second latched result.

6. The method of claim 1 further comprising:
   obtaining, by the IC component, a first gated result responsive to the synchronization control signal and the clock generator divider integer setting;
   obtaining, by the IC component, a second gated result responsive to the synchronization control signal and the component divider integer setting;
   obtaining, by the IC component, a first latched result responsive to the first gated result and the updated root clock signal;
   obtaining, by the IC component, a second latched result responsive to the second gated result and the updated root clock signal;
   obtaining, by the IC component, a comparison result responsive to the first latched result and the second latched result; and
   generating, by the IC component, the updated component clock signal responsive to the comparison result.

7. The method of claim 1 further comprising:
   obtaining, by the IC component, a first gated result responsive to the synchronization control signal and the clock generator divider integer setting;
   obtaining, by the IC component, a second gated result responsive to the synchronization control signal and the component divider integer setting;
   obtaining, by the IC component, a first latched result responsive to the first gated result and the updated root clock signal;
   obtaining, by the IC component, a second latched result responsive to the second gated result and the updated root clock signal;
   obtaining, by the IC component, a comparison result responsive to the first latched result and the second latched result;
   obtaining, by the IC component, a selection result responsive to the comparison result, the second latched result, and a selection control signal; and
   generating, by the IC component, the updated component clock signal responsive to the selection result.

8. The method of claim 1, wherein generating the updated component clock signal is based on selectively gating pulses of the updated root clock signal responsive to the clock generator divider integer setting and the component divider integer setting.

9. The method of claim 1, wherein the updated component clock signal has the same frequency and a different pulse duration relative to the component clock signal.

10. A system comprising:
    an integrated circuit (IC) component configured to:
      receive a root clock signal;
      generate a component clock signal responsive to the root clock signal;
      receive an updated root clock signal, the updated root clock signal having a different frequency than the root clock signal;
      receive a synchronization control signal and a clock generator divider integer setting used to generate the updated root clock signal; and
      generate an updated component clock signal responsive to the updated root clock signal, the synchronization control signal, the clock generator divider integer setting, and a component divider integer setting; and
    a clock generator coupled to the IC component and configured to provide the root clock signal, the update root clock signal, the synchronization control signal, and the clock generator divider integer setting to the IC component.

11. The system of claim 10, wherein the component divider integer setting is a first component divider integer setting and the IC component is configured to generate the component clock signal responsive to the root clock signal and a second component divider integer setting different than the first component divider integer setting.

12. The system of claim 10, wherein the clock generator is configured to:
- track an alignment position for the updated root clock signal, the updated component clock signal, and an input clock signal used to generate the updated root clock signal; and
- provide the synchronization control signal to the IC component at a time that is based on the tracked alignment position.

13. The system of claim 10, wherein the IC component is configured to:
- obtain a first gated result responsive to the synchronization control signal and the clock generator divider integer setting;
- obtain a second gated result responsive to the synchronization control signal and the component divider integer setting; and
- generate the updated component clock signal responsive to the first gated result and the second gated result.

14. The system of claim 10, wherein the IC component is configured to:
- obtain a first gated result responsive to the synchronization control signal and the clock generator divider integer setting;
- obtain a second gated result responsive to the synchronization control signal and the component divider integer setting;
- obtain a first latched result responsive to the first gated result and the updated root clock signal;
- obtain a second latched result responsive to the second gated result and the updated root clock signal; and
- generate the updated component clock signal responsive to the first latched result and the second latched result.

15. The system of claim 10, wherein the IC component is configured to:
- obtain a first gated result responsive to the synchronization control signal and the clock generator divider integer setting;
- obtain a second gated result responsive to the synchronization control signal and the component divider integer setting;
- obtain a first latched result responsive to the first gated result and the updated root clock signal;
- obtain a second latched result responsive to the second gated result and the updated root clock signal;
- obtain a comparison result responsive to the first latched result and the second latched result; and
- generate the updated component clock signal responsive to the comparison result.

16. The system of claim 10, wherein the IC component is configured to:
- obtain a first gated result responsive to the synchronization control signal and the clock generator divider integer setting;
- obtain a second gated result responsive to the synchronization control signal and the component divider integer setting;
- obtain a first latched result responsive to the first gated result and the updated root clock signal;
- obtain a second latched result responsive to the second gated result and the updated root clock signal;
- obtaining a comparison result responsive to the first latched result and the second latched result;
- obtain a selection result responsive to the comparison result, the second latched result, and a selection control signal; and
- generate the updated component clock signal responsive to the selection result.

17. The system of claim 16, wherein the IC component is configured to adjust the selection control signal responsive to an accumulator result being positive or negative.

18. The system of claim 10, wherein the IC component is configured to generate the updated component clock signal by selectively gating pulses of the updated root clock signal responsive to the clock generator divider integer setting and the component divider integer setting.

19. The system of claim 10, wherein the IC component is a processor.

20. The system of claim 19, wherein IC component is a peripheral.

* * * * *